(12) United States Patent
Chen

(10) Patent No.: US 10,249,697 B2
(45) Date of Patent: Apr. 2, 2019

(54) DISPLAY PANEL AND DISPLAY DEVICE

(71) Applicant: Wuhan China Star Optoelectronics Technology Co., Ltd., Wuhan, Hubei (CN)

(72) Inventor: Caiqin Chen, Hubei (CN)

(73) Assignee: Wuhan China Star Optoelectronics Technology Co., Ltd., Wuhan (CN)

(*) Notice: Subject to any disclaimer, the term of this patent is extended or adjusted under 35 U.S.C. 154(b) by 115 days.

(21) Appl. No.: 15/327,471

(22) PCT Filed: Dec. 28, 2016

(86) PCT No.: PCT/CN2016/112719
§ 371 (c)(1),
(2) Date: Jan. 19, 2017

(87) PCT Pub. No.: WO2018/119783
PCT Pub. Date: Jul. 5, 2018

(65) Prior Publication Data
US 2018/0212015 A1    Jul. 26, 2018

(30) Foreign Application Priority Data
Dec. 26, 2016 (CN) .............................. 201611216250

(51) Int. Cl.
*H01L 21/00* (2006.01)
*H01L 27/32* (2006.01)
*H01L 51/00* (2006.01)

(52) U.S. Cl.
CPC ...... *H01L 27/3276* (2013.01); *H01L 27/3258* (2013.01); *H01L 51/0097* (2013.01); *H01L 2251/5338* (2013.01)

(58) Field of Classification Search
CPC ............. H01L 27/3276; H01L 51/0097; H01L 2251/5338
See application file for complete search history.

(56) References Cited

U.S. PATENT DOCUMENTS 9,356,087 B1 * 5/2016 Lee ..................... H01L 27/3276
2012/0062447 A1   3/2012 Tseng et al.
(Continued)

FOREIGN PATENT DOCUMENTS

AU    2012223710 A1 * 8/2013 ......... H01L 27/3276
CN    102683384 A  *  9/2012 ......... H01L 27/3276
(Continued)

OTHER PUBLICATIONS

International Search Report and Written Opinion for International Application No. PCT/CN2017/112719, dated Sep. 27, 2017.
(Continued)

*Primary Examiner* — Laura M Menz

(57) ABSTRACT

Disclosed are a display panel and a display device. The display panel includes an active area and two GOA driving circuit areas which are respectively arranged on a right side and a left side of the active area, wherein the display panel is bent along bending positions formed by gaps between the active area and each of the GOA driving circuit areas. Performance of metal lines at the bending positions can be improved and the display panel has an ultra-narrow frame.

12 Claims, 3 Drawing Sheets

(56) References Cited

U.S. PATENT DOCUMENTS

| | | | | |
|---|---|---|---|---|
| 2012/0218219 A1* | 8/2012 | Rappoport | .......... | H01L 27/3276 345/174 |
| 2016/0240605 A1* | 8/2016 | Lee | ..................... | H01L 27/3276 |
| 2017/0287999 A1* | 10/2017 | Kimura | ............... | H01L 27/3262 |
| 2018/0212015 A1* | 7/2018 | Chen | ................... | H01L 27/3276 |

FOREIGN PATENT DOCUMENTS

| | | | |
|---|---|---|---|
| CN | 104157233 A | 11/2014 | |
| CN | 104521331 A | 4/2015 | |
| CN | 104733498 A | 6/2015 | |
| CN | 105074802 A | 11/2015 | |
| WO | WO-2012118613 A1 * | 9/2012 | ......... H01L 27/3276 |

OTHER PUBLICATIONS

Chinese Office Action and Search Report for Chinese Patent Application No. 201611216250.4 dated Jun. 5, 2018.

* cited by examiner

DISPLAY PANEL AND DISPLAY DEVICE

CROSS-REFERENCE TO RELATED APPLICATIONS

This application claims the priority of Chinese patent application CN201611216250.4, entitled "Display panel and display device" and filed on Dec. 26, 2016, the entirety of which is incorporated herein by reference.

FIELD OF THE INVENTION

The present disclosure relates to the technical field of display, and in particular, to a display panel and a display device with an ultra-narrow frame.

BACKGROUND OF THE INVENTION

Flexible active organic light emitting diode display screen relates to a new display technology of manufacturing thin film transistors and organic light emitting diodes on a flexible substrate. At present, since packing, vapor plating and other technologies of flexible substrate require a relatively large frame width, it is hard to manufacture the frame with a width in a range from 0.5 mm to 1.0 mm like liquid crystal display screen. However, based on the flexible and bendable features, the frames can be bent to a backside of a display panel, so that requirements for narrow frame or non-frame can be met.

A conventional method of bending the frame to the backside of the display panel is to bend the panel at a wireless position between a gate on array (GOA, i.e., scanning technology formed on array substrate) circuit and a frame. The problem of wiring stress in the GOA circuit area does not need to be considered, but the frame width is still larger than 0.5 mm.

SUMMARY OF THE INVENTION

In order to solve the above problem, the present disclosure provides a display panel and a display device to improve performance of metal wires at bending positions and to obtain an ultra-narrow frame.

According to one aspect of the present disclosure, a display panel is provided, which comprises:

an active area.

two GOA driving circuit areas which are respectively arranged on a right side and a left side of the active area, wherein the display panel is bent along bending positions formed by gaps between the active area and each of the GOA driving circuit areas.

According to one embodiment of the present disclosure, a serpentine metal line connecting a GOA driving circuit and an internal circuit of the active area is arranged in the display panel at a position corresponding to each of the bending positions.

According to one embodiment of the present disclosure, the serpentine metal line is contained in a jumper joint structure of different layers of metal lines.

According to one embodiment of the present disclosure, the jumper joint structure of different layers of metal lines comprises:

a first metal layer, which is in a same layer as a first lead line of the GOA driving circuit and a second lead line of the internal circuit of the active area, wherein metal jumper lines without contacting each other, are arranged between the first lead line and the second lead line;

a first insulating layer, arranged on the first metal layer;

an inorganic dielectric layer, arranged on the first insulating layer, and having via holes at positions corresponding to two ends of each of the metal jumper lines;

jumpers without contacting each other, arranged on the inorganic dielectric layer and connected to the corresponding metal jumper lines in sequence through the via holes to form the serpentine metal line; and an organic dielectric layer, arranged on the jumpers and the exposed inorganic dielectric layer.

According to one embodiment of the present disclosure, the jumper joint structure of different layers of metal lines comprises:

a first metal layer, which is in a same layer as a first lead line of the GOA driving circuit and a second lead line of the internal circuit of the active area, wherein metal jumper lines without contacting each other, are arranged between the first lead line and the second lead line;

a first insulating layer, arranged on the first metal layer;

an inorganic dielectric layer, arranged on the first insulating layer;

an organic dielectric layer, arranged on the inorganic dielectric layer, and having via holes at positions corresponding to two ends of each of the metal jumper lines;

jumpers without contacting each other, arranged on the organic dielectric layer and connected to the corresponding metal jumper lines in sequence through the via holes to form the serpentine metal line; and an organic planarization layer, arranged on the jumpers and the exposed organic dielectric layer.

According to one embodiment of the present disclosure, the jumper joint structure of different layers of metal lines comprises:

a first metal layer, which is in a same layer as a first lead line of the GOA driving circuit and a second lead line of the internal circuit of the active area, wherein metal jumper lines without contacting each other, are arranged between the first lead line and the second lead line;

a first insulating layer, arranged on the first metal layer;

an inorganic dielectric layer, arranged on the first insulating layer;

an organic dielectric layer, arranged on the inorganic dielectric layer;

an organic planarization layer, arranged on the organic dielectric layer, and having via holes at positions corresponding to two ends of each of the metal jumper lines;

jumpers without contacting each other, arranged on the organic planarization layer and connected to the corresponding metal jumper lines in sequence through the via holes to form the serpentine metal line; and an organic protection layer, arranged on the jumpers and the exposed organic planarization layer.

According to one embodiment of the present disclosure, a cell group test and electrostatic protection circuit area is arranged above the active area, and the display panel is bent along a bending position formed by a gap between the active area and the cell group test and electrostatic protection circuit area.

According to one embodiment of the present disclosure, a demultiplexing circuit area, a control chip area and a fan circuit area are arranged below the active area in sequence, and the display panel is bent along a bending position in an area below the fan circuit area.

According to one embodiment of the present disclosure, a frame width of the display panel is less than or equal to 0.5 mm.

According to the other aspect of the present disclosure, a display device comprising the above display panel is further provided.

The following beneficial effects can be brought about by the present disclosure.

According to the present disclosure, by changing the bending positions of the display panel, the design of ultra-narrow frame panel can be achieved, and performance of metal wires at the bending positions can be improved.

Other advantages, objectives, and features of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the technical solution of the present disclosure or the prior art, and constitute one part of the description. The accompanying drawings expressing the embodiments of the present application are used for interpreting the technical solutions of the present application together with the embodiments, not for limiting the technical solutions of the present application. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. All the technical features mentioned in all the embodiments, as long as there is no structural conflict, may be combined together in any manner, and the technical solutions obtained in this manner all fall within the scope of the present disclosure.

Figure 1:
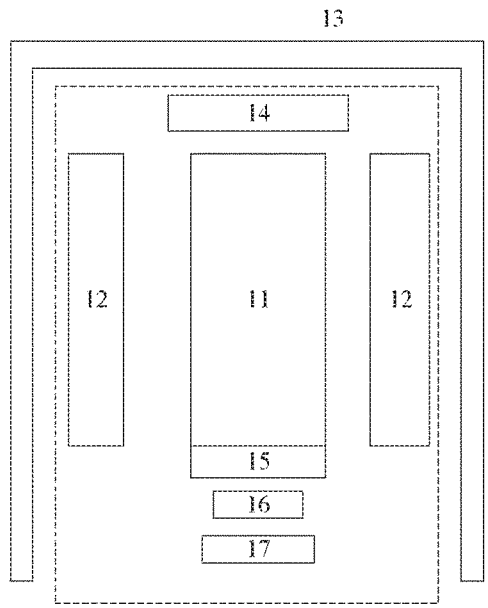
FIG. 1 schematically shows bending positions of a display panel in the prior art.

FIG. 1 schematically shows bending positions of a display panel in the prior art, wherein dashed lines represent the bending positions. As can be seen from FIG. 1, the bending positions on a right side and a left side of an active area 11 are arranged between GOA driving circuits 12 and a frame 13. The bending position above the active area 11 is arranged between a cell group test and electrostatic protection circuit area 14 and the frame 13. A demultiplexing circuit area 15, a control chip area 16 and a flexible circuit board area 17 are arranged below the active area 11 in sequence. The bending position below the active area 11 is arranged below the flexible circuit board area 17. It can be seen from FIG. 1 that, an area after the display panel is bent is an inner part of the dashed lines.

Figure 2:
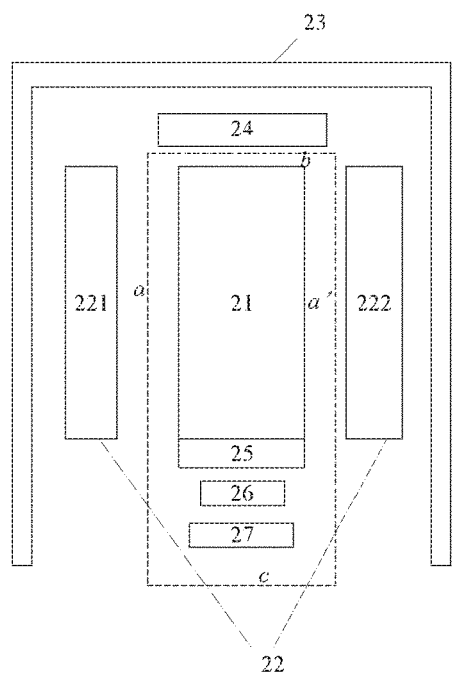
FIG. 2 schematically shows bending positions of a display panel according to one embodiment of the present disclosure.

The present disclosure provides a display panel. By changing the bending positions corresponding to each area in FIG. 1 and selecting bending positions between an active area and GOA driving circuit areas, a structure with a frame narrower than that of FIG. 1 can be obtained. FIG. 2 schematically shows bending positions of a display panel according to one embodiment of the present disclosure, and the present disclosure will be illustrated in detail hereinafter with reference to FIG. 2.

As shown in FIG. 2, the display panel comprises an active area 21 and two GOA driving circuit areas 22. The active area 21 is provided with an array display circuit, and a frame 23 is arranged on left, right and upper sides thereof. The GOA driving circuit areas are provided with GOA driving circuits. One GOA driving circuit area 221 is arranged between a left side of the active area 21 and the frame area 23, and the other GOA driving circuit area 222 is arranged between a right side of the active area 21 and the frame 23. The display panel is bent along the bending positions formed by gaps between the active area 21 and the GOA driving circuit areas 221 and 222.

Figure 3A:
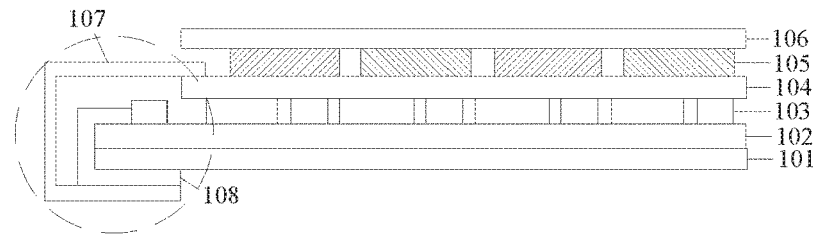
FIG. 3a schematically shows a bending of an upper side of the display panel in the prior art.
Figure 3B:
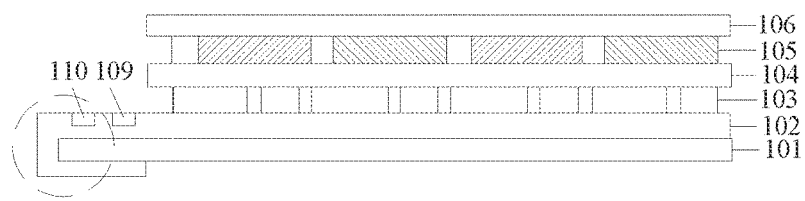
FIG. 3b schematically shows a bending of a left side of the display panel in the prior art.
Figure 4:
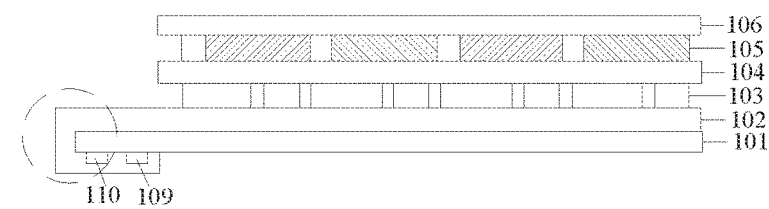
FIG. 4 schematically shows a bending of a left side of the display panel according to one embodiment of the present disclosure.

Specifically, as shown in FIG. 2, the display panel is bent along a bending position formed by a gap between the GOA driving circuit area 221 and the active area 21, i.e. the display panel is bent backwards along a clashed line a. Meanwhile, the display panel is bent along a bending position formed by a gap between the GOA driving circuit area 222 and the active area 21, i.e. the display panel is bent backwards along a dashed line a'. In this manner, the bending positions formed by the gaps between the GOA driving circuit areas and the frame are changed into the gaps between the GOA driving circuit areas and the active area. Therefore, a distance between the active area and edges of the display panel can be reduced, i.e. a frame width can be reduced. FIG. 3b schematically shows a bending of a left side of the display panel in the prior art, and FIG. 4 schematically shows a bending of a left side of the display panel according to one embodiment of the present disclosure. As can be seen from a comparison of FIG. 3b and FIG. 4, the GOA driving circuit in FIG. 4 is located on a back side of the display panel, and a frame width in FIG. 4 is obviously smaller than a frame width in FIG. 3b. A TFT backplate 102 is arranged on a substrate 101; a light-emitting layer 103 is arranged on the TFT backplate 102; a PI polymer layer 104 is arranged on the light-emitting layer 103; a touch sensor layer 105 is arranged on the PI polymer layer 104; and an insulating layer 106 is arranged on the touch sensor layer 105. In FIG. 3b, the display panel is bent along a line outside a control emission circuit 110. However, in FIG. 4, the display panel is bent along a line between a GOA driving circuit 109 and the light-emitting layer 103.

According to one embodiment of the present disclosure, a serpentine metal line connecting a GOA driving circuit and an internal circuit of the active area is arranged in the display panel at a position corresponding to each of the bending positions. The GOA driving circuit provides scanning signals to the internal circuit of the active area. In the prior art, a linear metal line connecting the GOA driving circuit and the internal circuit of the active area is configured to transmit the scanning signals. Instead of the linear metal line, the serpentine metal line is used in the present disclosure. In this manner, a length of the metal line connecting the two circuits can be increased, so that the positions are not likely to break while the display panel is bent, and the poor performance of the lines due to panel bending can be alleviated.

According to one embodiment of the present disclosure, the serpentine metal line is contained in a jumper joint structure of different layers of metal lines. That is, the serpentine metal line uses a jumper joint method. Part of the serpentine metal line is located on one layer, and the other part thereof is located on the other layer, whereby a length of the metal line can be increased.

Figure 5:
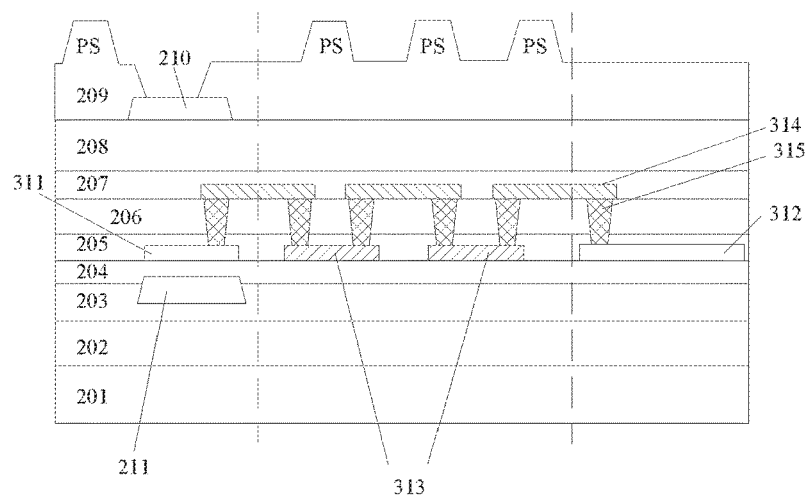
FIG. 5 schematically shows a jumper joint structure of different layers of metal lines according to a first embodiment of the present disclosure.

According to one embodiment of the present disclosure, the jumper joint structure of different layers of metal lines comprises a first metal layer, a first insulating layer, an inorganic dielectric layer, jumpers without contacting each other and an organic dielectric layer. As shown in FIG. 5, the first metal layer is in a same layer as a first lead line 311 of the GOA driving circuit and a second lead line 312 of the internal circuit of the active area. Metal jumper lines 313 without contacting each other are arranged between the first lead line 311 and the second lead line 312. The first insulating layer 205 is arranged on the first metal layer. The inorganic dielectric layer 206 is arranged on the first insulating layer 205, and has via holes 315 at positions corresponding to two ends of each of the metal jumper lines 313. The jumpers 314 without contacting each other are arranged on the inorganic dielectric layer 206, and are connected to the corresponding metal jumper lines 313 in sequence through the via holes 315 to form the serpentine metal line. The organic dielectric layer 207 is arranged on the jumpers 314 and the exposed inorganic dielectric layer 206.

In this manner, without contacting each other, the jumpers 314 and the metal jumper lines 313 are connected correspondingly in sequence to form the serpentine metal line, so that a metal stress can be better released and the poor performance of the lines due to panel bending can be alleviated. The jumpers 314 of the serpentine metal line are arranged in the organic dielectric layer formed by organic polymers. Since the organic polymers have good elasticity and flexibility, the metal lines arranged therebetween with poor stress can be well protected. With respect to materials of each layer in the jumper joint structure, conventional materials for forming each of the layers in the prior art can be used. As to the organic dielectric layer where the jumpers 314 are located, the organic polymer materials are preferably selected.

As shown in FIG. 5, besides the jumper joint structure of different layers of metal lines, the bending position further comprises other structures. The bending position specifically comprises a PI polymer layer 201 arranged on a glass substrate, an adhesive layer 202 arranged on the PI polymer layer 201 for blocking SiOx, a buffer layer 203 arranged on the adhesive layer 202, a polysilicon layer 211 arranged on the buffer layer 203, an interlayer insulating layer 204 arranged on the polysilicon layer 211, the first metal layer, the first insulating layer 205, the inorganic dielectric layer 206, the jumpers 314 without contacting each other and the organic dielectric layer 207 that are arranged in sequence on the interlayer insulating layer 204, an organic planarization layer 208 arranged on the organic dielectric layer 207, an organic protection layer 209 arranged on the organic pla-narization layer 208 (which is provided with a spacer PS thereon with a same material) and an anode metal layer 210.

Figure 6:
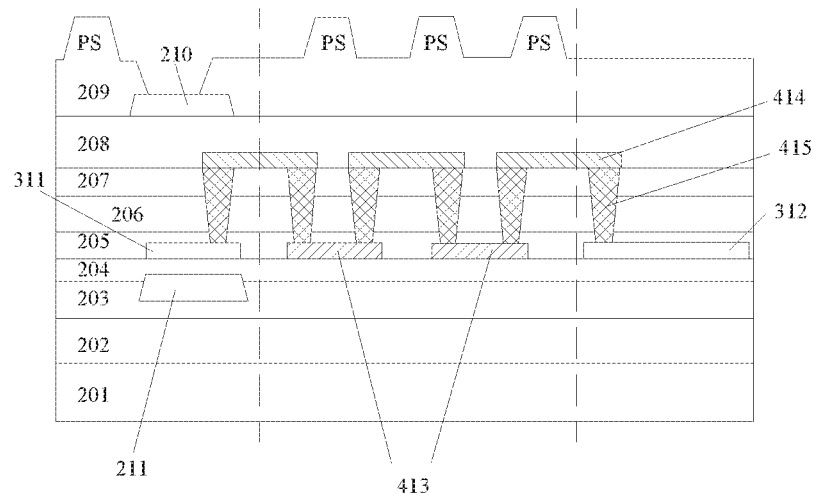
FIG. 6 schematically shows a jumper joint structure of different layers of metal lines according to a second embodiment of the present disclosure.

According to one embodiment of the present disclosure, the jumper joint structure of different layers of metal lines comprises a first metal layer, a first insulating layer, an inorganic dielectric layer, an organic dielectric layer, jumpers without contacting each other, and an organic planarization layer. As shown in FIG. 6, the first metal layer is in a same layer as a first lead line 311 of the GOA driving circuit and a second lead line 312 of the internal circuit of the active area. Metal jumper lines 413 without contacting each other are arranged between the first lead line 311 and the second lead line 312. The first insulating 205 is arranged on the first metal layer. The inorganic dielectric layer 206 is arranged on the first insulating layer 205. The organic dielectric layer 207 is arranged on the inorganic dielectric layer 206, and has via holes 415 at positions corresponding to two ends of each of the metal jumper lines 413. The jumpers 414 without contacting each other are arranged on the organic dielectric layer 207, and are connected to the corresponding metal jumper lines 413 in sequence through the via holes 415 to form the serpentine metal line. The organic planarization layer 208 is arranged on the jumpers 414 and the exposed organic dielectric layer 207. Compared with FIG. 5, positions of the jumpers in FIG. 6 are changed, and the jumpers 414 are arranged in the organic planarization layer 208 made of organic polymer materials. In this manner, the metal lines arranged therebetween with poor stress can be also well protected, and other structures are not changed.

Figure 7:
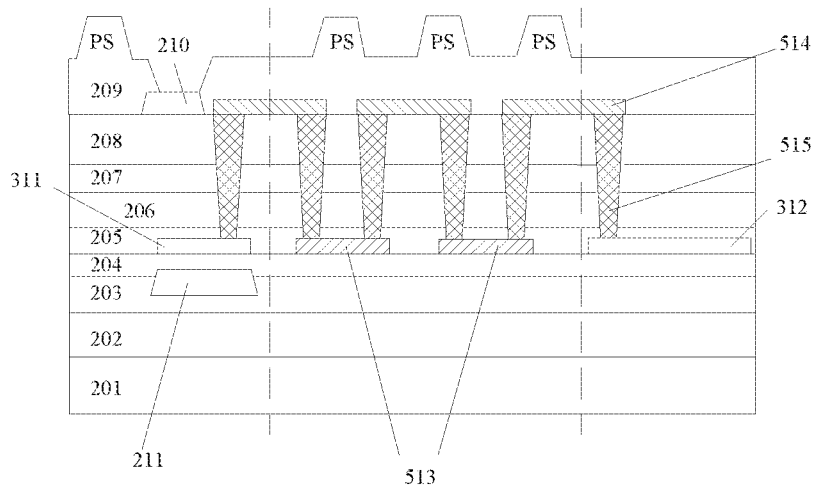
FIG. 7 schematically shows a jumper joint structure of different layers of metal lines according to a third embodiment of the present disclosure.

According to one embodiment of the present disclosure, the jumper joint structure of different layers of metal lines comprises a first metal layer, a first insulating layer, an inorganic dielectric layer, an organic dielectric layer, an organic planarization layer, jumpers without contacting each other and an organic protection layer. As shown in FIG. 7, the first metal layer is in a same layer as a first lead line 311 of the GOA driving circuit and a second lead line 312 of the internal circuit of the active area. Metal jumper lines 513 without contacting each other are arranged between the first lead line 311 and the second lead line 312. The first insulating layer 205 is arranged on the first metal layer. The inorganic dielectric layer 206 is arranged on the first insulating layer 205. The organic dielectric layer 207 is arranged on the inorganic dielectric layer 206. The organic planarization layer 208 is arranged on the organic dielectric layer 207, and has via holes 515 at positions corresponding to two ends of each of the metal jumper lines 513. The jumpers 514 without contacting each other are arranged on the organic planarization layer 208, and are connected to the corresponding metal jumper lines 513 in sequence through the via holes 515 to form the serpentine metal line. The organic protection layer 209 is arranged on the jumpers 514 and the exposed organic planarization layer 208. Compared with FIG. 5 and FIG. 6, positions of the jumpers in FIG. 7 are changed, and the jumpers are arranged in the organic protection layer 208 made of organic polymer materials. In this manner, the metal lines arranged therebetween with poor stress can be also well protected, and the other structures are not changed.

According to one embodiment of the present disclosure, a cell group test and electrostatic protection circuit area 24 is arranged above the active area 21, and the display panel is bent along a bending position formed by a gap between the active area 21 and the cell group test and electrostatic protection circuit area 24, as shown in a dashed line b in FIG. 2. With respect to the bending position above the display panel in FIG. 1, the corresponding schematic diagram of the bending thereof is shown in FIG. 3a, and a touch flexible circuit board 107 and a light emitting diode flexible circuit board 108 need to be bent. Compared with FIG. 1, the display panel can have a relatively narrower frame width if it is bent along the dashed line b in FIG. 2.

According to one embodiment of the present disclosure, a demultiplexing circuit area 25, a control chip area 26 and a fan circuit area 27 are arranged below the active area 21 in sequence, and the display panel is bent along a bending position in an area below the fan circuit area 27, as shown in the dashed line c in FIG. 2.

According to one embodiment of the present disclosure, a frame width of the display panel is less than or equal to 0.5 mm. By changing the bending positions of the display panel, the frame width can be configured to be less than or equal to 0.5 mm.

According to the other aspect of the present disclosure, a display device comprising the aforesaid display panel is further provided. The display device has the display panel with an ultra-narrow frame, and the performance of metal wirings in bending positions thereof can be improved.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A display panel, comprising:
an active area; and
two GOA driving circuit areas which are arranged respectively on a right side and a left side of the active area,
wherein the display panel is bent along bending positions formed by gaps between the active area and each of the GOA driving circuit areas,
wherein a serpentine metal line connecting a GOA driving circuit and an internal circuit of the active area is arranged in the display panel at a position corresponding to each of the bending positions,
wherein the serpentine metal line is contained in a jumper joint structure of different layers of metal lines,
wherein the jumper joint structure of different layers of metal lines comprises:
a first metal layer, which is in a same layer as a first lead line of the GOA driving circuit and a second lead line of the internal circuit of the active area, wherein metal jumper lines without contacting each other, are arranged between the first lead line and the second lead line;
a first insulating layer, arranged on the first metal layer;
an inorganic dielectric layer, arranged on the first insulating layer, and having via holes at positions corresponding to two ends of each of the metal jumper lines;
jumpers without contacting each other, arranged on the inorganic dielectric layer and connected to the corresponding metal jumper lines in sequence through the via holes to form the serpentine metal line; and
an organic dielectric layer, arranged on the jumpers and the exposed inorganic dielectric layer.

2. A display panel, comprising:
an active area; and
two GOA driving circuit areas which are arranged respectively on a right side and a left side of the active area,
wherein the display panel is bent along bending positions formed by gaps between the active area and each of the GOA driving circuit areas,
wherein a serpentine metal line connecting a GOA driving circuit and an internal circuit of the active area is arranged in the display panel at a position corresponding to each of the bending positions,
wherein the serpentine metal line is contained in a jumper joint structure of different layers of metal lines,
wherein the jumper joint structure of different layers of metal lines comprises:
a first metal layer, which is in a same layer as a first lead line of the GOA driving circuit and a second lead line of the internal circuit of the active area, wherein metal jumper lines without contacting each other, are arranged between the first lead line and the second lead line;
a first insulating layer, arranged on the first metal layer;
an inorganic dielectric layer, arranged on the first insulating layer;
an organic dielectric layer, arranged on the inorganic dielectric layer, and having via holes at positions corresponding to two ends of each of the metal jumper lines;
jumpers without contacting each other, arranged on the organic dielectric layer and connected to the corresponding metal jumper lines in sequence through the via holes to form the serpentine metal line; and
an organic planarization layer, arranged on the jumpers and the exposed organic dielectric layer.

3. A display panel, comprising:
an active area; and
two GOA driving circuit areas which are arranged respectively on a right side and a left side of the active area,
wherein the display panel is bent along bending positions formed by gaps between the active area and each of the GOA driving circuit areas,
wherein a serpentine metal line connecting a GOA driving circuit and an internal circuit of the active area is arranged in the display panel at a position corresponding to each of the bending positions,
wherein the serpentine metal line is contained in a jumper joint structure of different layers of metal lines,
wherein the jumper joint structure of different layers of metal lines comprises:
a first metal layer, which is in a same layer as a first lead line of the GOA driving circuit and a second lead line of the internal circuit of the active area, wherein metal jumper lines without contacting each other, are arranged between the first lead line and the second lead line;
a first insulating layer, arranged on the first metal layer;
an inorganic dielectric layer, arranged on the first insulating layer;
an organic dielectric layer, arranged on the inorganic dielectric layer;
an organic planarization layer, arranged on the organic dielectric layer, and having via holes at positions corresponding to two ends of each of the metal jumper lines;
jumpers without contacting each other, arranged on the organic planarization layer and connected to the corresponding metal jumper lines in sequence through the via holes to form the serpentine metal line; and
an organic protection layer, arranged on the jumpers and the exposed organic planarization layer.

4. The display panel according to claim 1, wherein a cell group test and electrostatic protection circuit area is arranged above the active area, and the display panel is bent along a bending position formed by a gap between the active area and the cell group d electrostatic protection circuit area.

5. The display panel according to claim 1, wherein a demultiplexing circuit area, a control chip area and a fan circuit area are arranged below the active area in sequence, and the display panel is bent along a bending position in an area below the fan circuit area.

6. The display panel according to claim 1, wherein a frame width of the display panel is less than or equal to 0.5 mm.

7. A display device, comprising a display panel, which comprises:
an active area; and
two GOA driving circuit areas which are arranged respectively on a right and a left side of the active area;
wherein the display panel is bent along bending positions formed by gaps between the active area and each of the GOA driving circuit areas,
wherein a serpentine metal line connecting a GOA driving circuit and an internal circuit of the active area is arranged in the display panel at a position corresponding to each of the bending positions,
wherein the serpentine metal line is contained in a jumper joint structure of different layers of metal lines,
wherein the jumper joint structure of different layers of metal lines comprises:
a first metal layer, which is in a same layer as a first lead line of the GOA driving circuit and a second lead line of the internal circuit of the active area, wherein metal jumper lines without contacting each other, are arranged between the first lead line and the second lead line;
a first insulating layer, arranged on the first metal layer;
an inorganic dielectric layer, arranged on the first insulating layer, and having via holes at positions corresponding to two ends of each of the metal jumper lines;
jumpers without contacting each other, arranged on the inorganic dielectric layer and connected to the corresponding metal jumper lines in sequence through the via holes to form the serpentinemetal line; and
an organic dielectric layer, arranged on the jumpers and the exposed inorganic dielectric layer.

8. A display device, comprising a display panel, which comprises:
an active area; and
two GOA driving circuit areas which are arranged respectively on a right and a left side of the active area;
wherein the display panel is bent along bending positions formed by gaps between the active area and each of the GOA driving circuit areas,
wherein a serpentine metal line connecting a GOA driving circuit and an internal circuit of the active area is arranged in the display panel at a position corresponding to each of the bending positions,
wherein the serpentine metal line is contained in a jumper joint structure of different layers of metal lines,
wherein the jumper joint structure of different layers of metal lines comprises:
a first metal layer, which is in a same layer as a first lead line of the GOA driving circuit and a second lead line of the internal circuit of the active area, wherein metal jumper lines without contacting each other, are arranged between the first lead line and the second lead line;
a first insulating layer arranged on the first metal layer;
an inorganic dielectric layer, arranged on the first insulating layer;
an organic dielectric layer, arranged on the inorganic dielectric layer, and having via holes at positions corresponding to two ends of each of the metal jumper lines;
jumpers without contacting each other, arranged on the organic dielectric layer and connected to the corresponding metal jumper lines in sequence through the via holes to form the serpentine metal line; and
an organic planarization layer, arranged on the jumpers and the exposed organic dielectric layer.

9. A display device, comprising a display panel, which comprises:
an active area; and
two GOA driving circuit areas which are arranged respectively on a right and a left side of the active area;
wherein the display panel is bent along bending positions formed by gaps between the active area and each of the GOA driving circuit areas,
wherein a serpentine metal line connecting a GOA driving circuit and an internal circuit of the active area is arranged in the display panel at a position corresponding to each of the bending positions,
wherein the serpentine metal line is contained in a jumper joint structure of different layers of metal lines,
wherein the jumper joint structure of different layers of metal lines comprises:
a first metal layer, which is in a same layer as a first lead line of the GOA driving circuit and a second lead line of the internal circuit of the active area, wherein metal jumper lines without contacting each other, are arranged between the first lead line and the second lead line;
a first insulating layer, arranged on the first metal layer;
an inorganic dielectric layer, arranged on the first insulating layer;
an organic dielectric layer, arranged on the inorganic dielectric layer;
an organic planarization layer, arranged on the organic dielectric layer, and having via holes at positions corresponding to two ends of each of the metal jumper lines;
jumpers without contacting each other, arranged on the organic planarization layer and connected to the corresponding metal jumper lines in sequence through the via holes to form the serpentine metal line; and
an organic protection layer, arranged on the jumpers and the exposed organic planarization layer.

10. The display device according to claim 9, wherein a cell group test and electrostatic protection circuit area is arranged above the active area, and the display panel is bent along a bending position formed by a gap between the active area and the cell group test and electrostatic protection circuit area.

11. The display device according to claim 9, wherein a demultiplexing circuit area, a control chip area and a fan circuit area are arranged below the active area in sequence, and the display panel is bent along a bending position in an area below the fan circuit area.

12. The display device according to claim 9, wherein a frame width of the display panel is less than or equal to 0.5 mm.

* * * * *